(12) United States Patent
Jindo et al.

(10) Patent No.: US 10,950,420 B2
(45) Date of Patent: Mar. 16, 2021

(54) ATMOSPHERIC PRESSURE PLASMA DEVICE

(71) Applicant: FUJI CORPORATION, Chiryu (JP)

(72) Inventors: Takahiro Jindo, Anjo (JP); Toshiyuki Ikedo, Nagoya (JP); Akihiro Niwa, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/499,654

(22) PCT Filed: Apr. 4, 2017

(86) PCT No.: PCT/JP2017/014091
§ 371 (c)(1),
(2) Date: Sep. 30, 2019

(87) PCT Pub. No.: WO2018/185836
PCT Pub. Date: Oct. 11, 2018

(65) Prior Publication Data
US 2020/0118801 A1    Apr. 16, 2020

(51) Int. Cl.
*H01J 37/32* (2006.01)
*G01M 3/26* (2006.01)

(52) U.S. Cl.
CPC ......... *H01J 37/32825* (2013.01); *G01M 3/26* (2013.01); *H01J 37/3299* (2013.01); *H01J 37/32449* (2013.01); *H01J 2237/006* (2013.01); *H01J 2237/24585* (2013.01)

(58) Field of Classification Search
CPC ........... H01J 37/32825; H01J 37/32449; H01J 37/3299; H01J 37/32935; H01J 37/32816; H01J 37/32091; H01J 2237/006; H01J 2237/24585; H01J 21/31138; G01M 3/26; G03F 7/427
See application file for complete search history.

(56) References Cited

U.S. PATENT DOCUMENTS

| 4,663,512 | A | 5/1987 | Kneeland et al. |
| 2001/0030541 | A1 | 10/2001 | Fujita |
| 2005/0173381 | A1 | 8/2005 | Delzenne |

(Continued)

FOREIGN PATENT DOCUMENTS

JP    2012-129356 A    7/2012

OTHER PUBLICATIONS

International Search Report dated Jul. 4, 2017 in PCT/JP2017/014091 filed on Apr. 4, 2017.

*Primary Examiner* — Henry Luong
(74) *Attorney, Agent, or Firm* — Obion, McClelland, Maier & Neustadt, L.L.P.

(57) ABSTRACT

An atmospheric pressure plasma device including a plasma head; a gas tube configured to supply a gas to the plasma head; a flow rate controller configured to control a flow rate of the gas supplied to the gas tube; a pressure sensor arranged downstream of the flow rate controller and configured to detect a pressure in the gas tube; and a determining section configured to determine a state of the device based on how the pressure in the gas tube deviates from a standard value specified for each flow rate of the supplied gas. As a result, it is possible to determine the gas leakage of the atmospheric pressure plasma device. Further, it is possible to determine whether plasma is being generated in a favorable state.

5 Claims, 10 Drawing Sheets

(56) References Cited

U.S. PATENT DOCUMENTS

2006/0186094 A1    8/2006  Krink et al.
2010/0276398 A1   11/2010  Halvorsen et al.
2017/0001255 A1*   1/2017  Winn .................. B23K 10/006
2017/0221732 A1*   8/2017  Laermer ............... H01J 37/321

* cited by examiner

ATMOSPHERIC PRESSURE PLASMA DEVICE

TECHNICAL FIELD

The present application relates to an atmospheric pressure plasma device, in particular, to an atmospheric pressure plasma device for detecting a pressure in a gas tube and determining a state of the device.

BACKGROUND ART

Conventionally, there is a plasma processing device for performing plasma processing on a target object which includes a pressure gauge for detecting the pressure in a gas tube. An example of such technology can be found in the "plasma processing device, plasma processing method, and storage medium" of JP-A-2012-129356. Disclosed therein is a plasma processing device that performs plasma processing of applying plasma of a processing gas to a target board, the device being provided with: a processing container in which the target board is accommodated and from which air can be evacuated; a lower electrode arranged in the processing container and that functions as a loading stand for the target board; an upper electrode arranged in the processing container facing the lower electrode and including a removable electrode plate that ejects a shower of processing gas inside the processing container; a gas supply unit including gas tube for supplying the processing gas to the upper electrode; a high-frequency electric power application unit for plasma generation that applies high-frequency electric power for plasma generation to at least one of upper electrode or the lower electrode; a pressure gauge that detects a pressure inside the gas tube; and a control section that determines a wear level of the electrodes based on the detection result of the pressure inside the gas tube detected by the pressure gauge, calculates a change in the processing rate based on the wear to the electrodes, and adjusts processing conditions to take account of the change in the processing rate.

CITATION LIST

Patent Literature

Patent literature 1: JP-A-2012-129356

BRIEF SUMMARY

Technical Problem

In patent literature 1, the wear of the electrode plate is obtained based on detection values of pressures in the gas tube, the change in the processing rate due to the wear of the electrode plates is calculated, and the processing conditions are adjusted so as to take account of the change in the processing rate. Therefore, plasma processing can always be performed at the same processing rate as when the electrode plate is not worn, and the change in the processing rate due to the wear of the electrode plate can be suppressed. On the other hand, in an atmospheric pressure plasma device, it has been required to detect the pressure in the gas tube using a pressure sensor, and for a determining section to determine the state of the device in accordance with the fact that the pressure in the gas tube deviates from a standard value.

Thus, an object of the present disclosure is to provide an atmospheric pressure plasma device that solves the above-mentioned problems.

Solution to Problem

To achieve the above object, an atmospheric pressure plasma device of the present application is atmospheric pressure plasma device including: a plasma head; a gas tube configured to supply a gas to the plasma head; a flow rate controller configured to control a flow rate of the gas supplied to the gas tube; a pressure sensor arranged downstream of the flow rate controller and configured to detect a pressure in the gas tube; and a determining section configured to determine a state of the device based on how the pressure in the gas tube deviates from a standard value specified for each flow rate of the supplied gas.

Advantageous Effects

The atmospheric pressure plasma device of the present application includes: a pressure sensor configured to detect a pressure in the gas tube; and a determining section configured to determine a state of the device based on how the pressure in the gas tube deviates from a standard value. As a result, the state of the atmospheric pressure plasma device, such as a plasma generation state from the plasma head or an error such as leakage or disconnection of the gas tube is determined.

DESCRIPTION OF EMBODIMENTS

Figure 1:
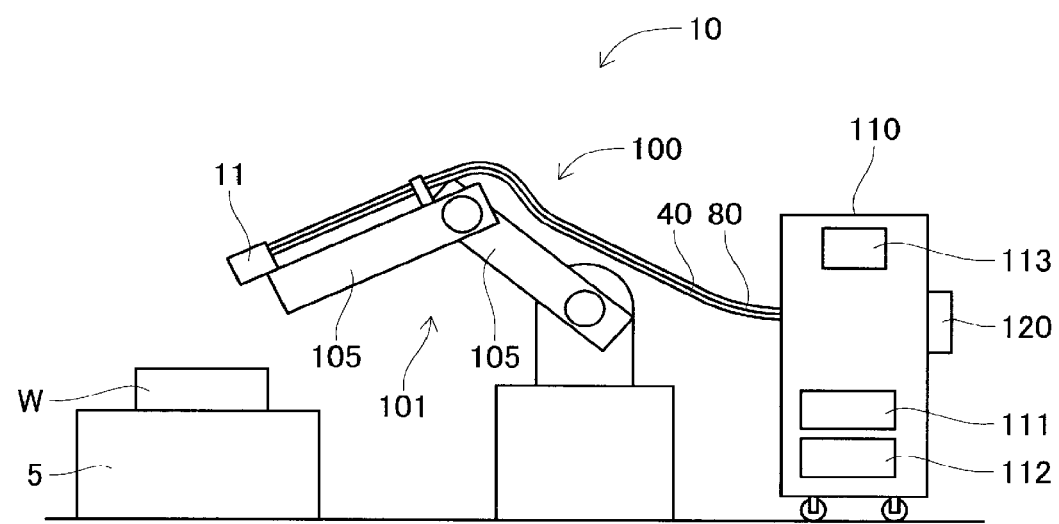
FIG. 1 is a schematic diagram showing the configuration of a plasma-generating device attached to an industrial robot.

Plasma-generating device 10 is provided with plasma head 11, control device 110, power cable 40, gas tube 80, detection module 120, and the like. Plasma-generating device 10 transmits power from control device 110 to plasma head 11 via power cable 40, supplies processing gas via gas tube 80, and causes plasma to be emitted from plasma head 11. Plasma head 11 is attached to the tip of robot arm 101 of industrial robot 100. Power cable 40 and gas tube 80 are mounted along robot arm 101. Robot arm 101 is a multi-joint robot in which two arm sections, 105 and 105, are connected in one direction. Industrial robot 100 drives robot arm 101 to apply plasma onto workpiece W supported by workpiece table 5. As described later, power cable 40 includes first cable 41, second cable 42, and ground cable 43. Gas tube 80 has first gas tube 81 and second gas tube 82. Control device 110 includes first processing gas supply device 111 and second processing gas supply device 112. First processing gas supply device 111 supplies an inert gas containing nitrogen or the like as a processing gas. Second processing gas supply device 112 supplies an active gas containing dry air or the like as a processing gas. Control device 110 also includes touchscreen panel 113. Touchscreen panel 113 displays various setting screens, operation states of the device, and the like.

Configuration of Plasma Head

Figure 2:
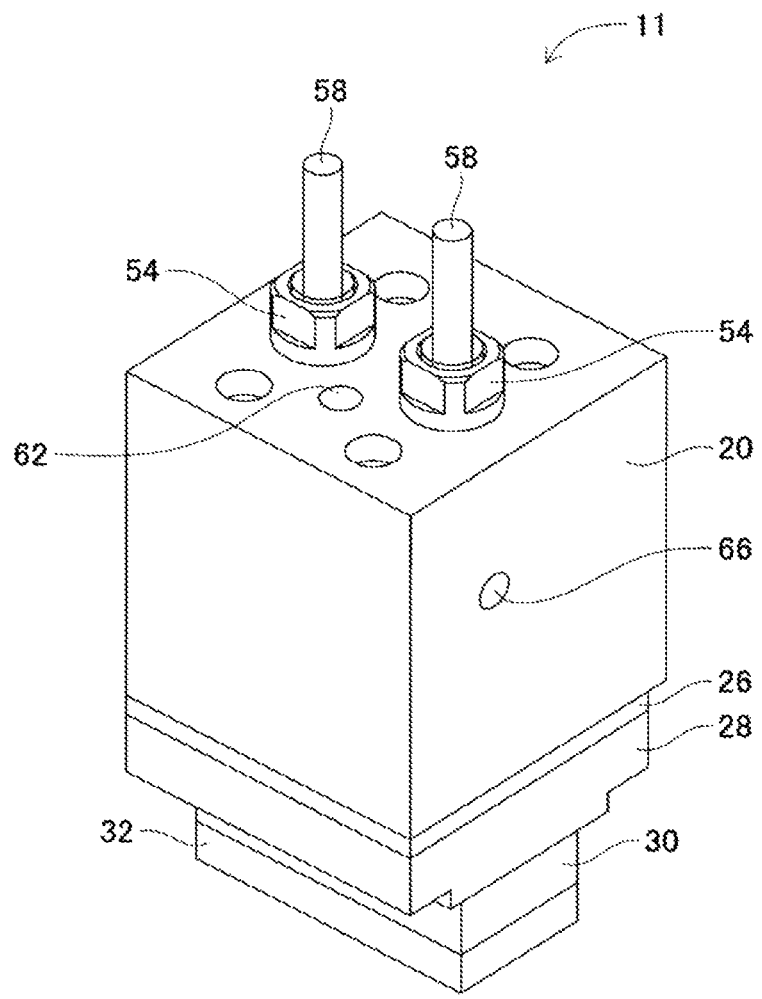
FIG. 2 is a perspective view of a plasma head.
Figure 2:
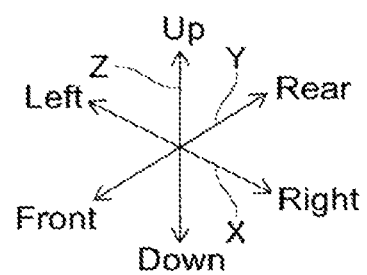
Figure 3:
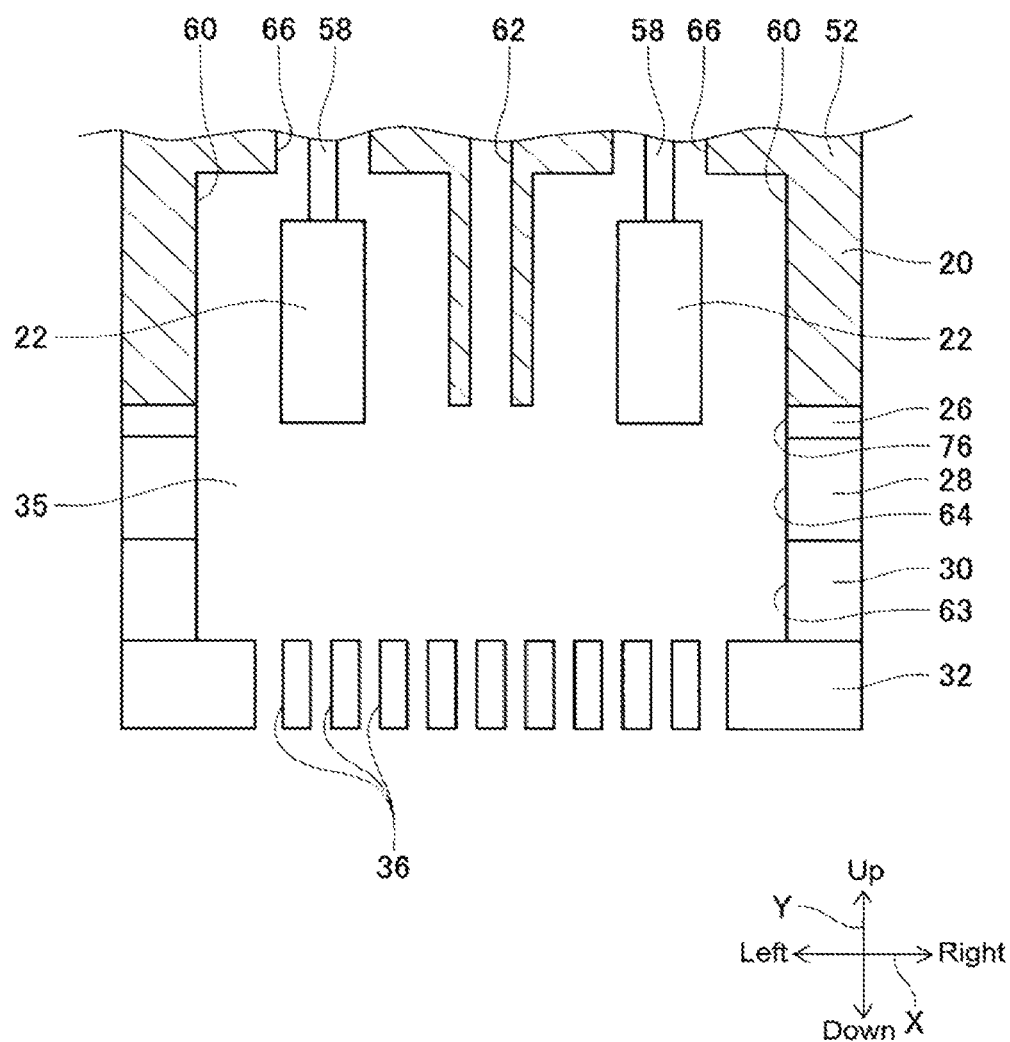
FIG. 3 is a cross-sectional view showing the internal structure of the plasma head.

Next, the configuration of plasma head 11 will be described with reference to FIGS. 2 and 3. As shown in FIG. 2, plasma head 11 includes main body block 20, pair of electrodes 22 (see FIG. 3), buffer member 26, first connecting block 28, reaction chamber block 30, and second connecting block 32. In the following description, directions are as shown in FIG. 2.

Holes (not shown) penetrating in the vertical direction are formed in the upper surface of main body block 20, and cylindrical upper holders 54 and 54 are attached to the penetrating holes. Bar-shaped conductive sections 58 and 58 are inserted into upper holders 54 and 54, and are fixedly held by upper holders 54 and 54. Conductive sections 58 and 58 are respectively electrically connected to first cable 41 and second cable 42. Pair of electrodes 22 are attached to the lower end sections of conductive sections 58 and 58. The pair of electrodes 22 are generally rod-shaped. In main body block 20, an opening of first gas flow path 62 penetrating in the vertical direction is formed at a position on the center line along the Y axis direction of the upper surface of main body block 20. Further, two openings of second gas flow path 66 are formed in the left and right surfaces of main body block 20. First gas tube 81 and second gas tube 82 are respectively physically connected to first gas flow path 62 and second gas flow path 66 (the connections are not shown in the figure).

Buffer member 26 has a generally plate shape and is formed of a material made of silicone resin. First connecting block 28, reaction chamber block 30, and second connecting block 32 are generally thick plates and formed of a ceramic material.

Next, the internal structure of plasma head 11 will be described with reference to FIG. 3. A pair of cylindrical recesses 60 are formed on the lower surface of main body block 20. Further, first gas flow path 62 and two second gas flow paths 66 are formed inside main body block 20. First gas flow path 62 opens between the pair of cylindrical recesses 60, and the two second gas flow paths 66 open inside the pair of cylindrical recesses 60. Second gas flow paths 66 extend from the left and right surfaces of main body block 20 toward the center of main body block 20 by a predetermined distance along the X axis direction, and then are bent downward. Further, first gas flow path 62 extends downward from the upper surface of main body block 20 by a predetermined distance along the Z-axis direction, then bends backward, and further bends downward.

Insertion section 76 connected with cylindrical recess 60 is formed in buffer member 26. Insertion section 64 connected with insertion section 76 is formed in first connecting block 28. Insertion section 63 connected with insertion section 64 is formed in reaction chamber block 30. Cylindrical recess 60, insertion section 76, insertion section 64, and insertion section 63 of main body block 20 are connected with each other, and the internal space therein is reaction chamber 35. Multiple connecting holes 36 are formed penetrating in the vertical direction in second connecting block 32. The multiple connecting holes 36 are formed in the central portion in the Y direction so as to be aligned in the X direction.

Plasma Application

Next, plasma generation in plasma-generating device 10 will be described. A mixed gas of an inert gas such as nitrogen and dry air is supplied as a processing gas to first gas flow path 62. The gas supplied to first gas flow path 62 is supplied to reaction chamber 35. In addition, an inert gas such as nitrogen is supplied to second gas flow path 66 as a processing gas. The inert gas supplied to second gas flow path 66 is supplied to reaction chamber 35. A voltage is applied to the pair of electrodes 22. As a result, a quasi-arc discharge occurs between the pair of electrodes 22, and a current flows. The process gas is converted into a plasma by the pseudo-arc discharge. Note that, a pseudo-arc discharge is a method of discharging while limiting the current by a plasma power supply so that a large current does not flow as with a normal arc discharge. The plasma generated in reaction chamber 35 is ejected through the multiple connecting holes 36 of second connecting block 32, such that plasma is applied to workpiece W.

Control System

Figure 4:
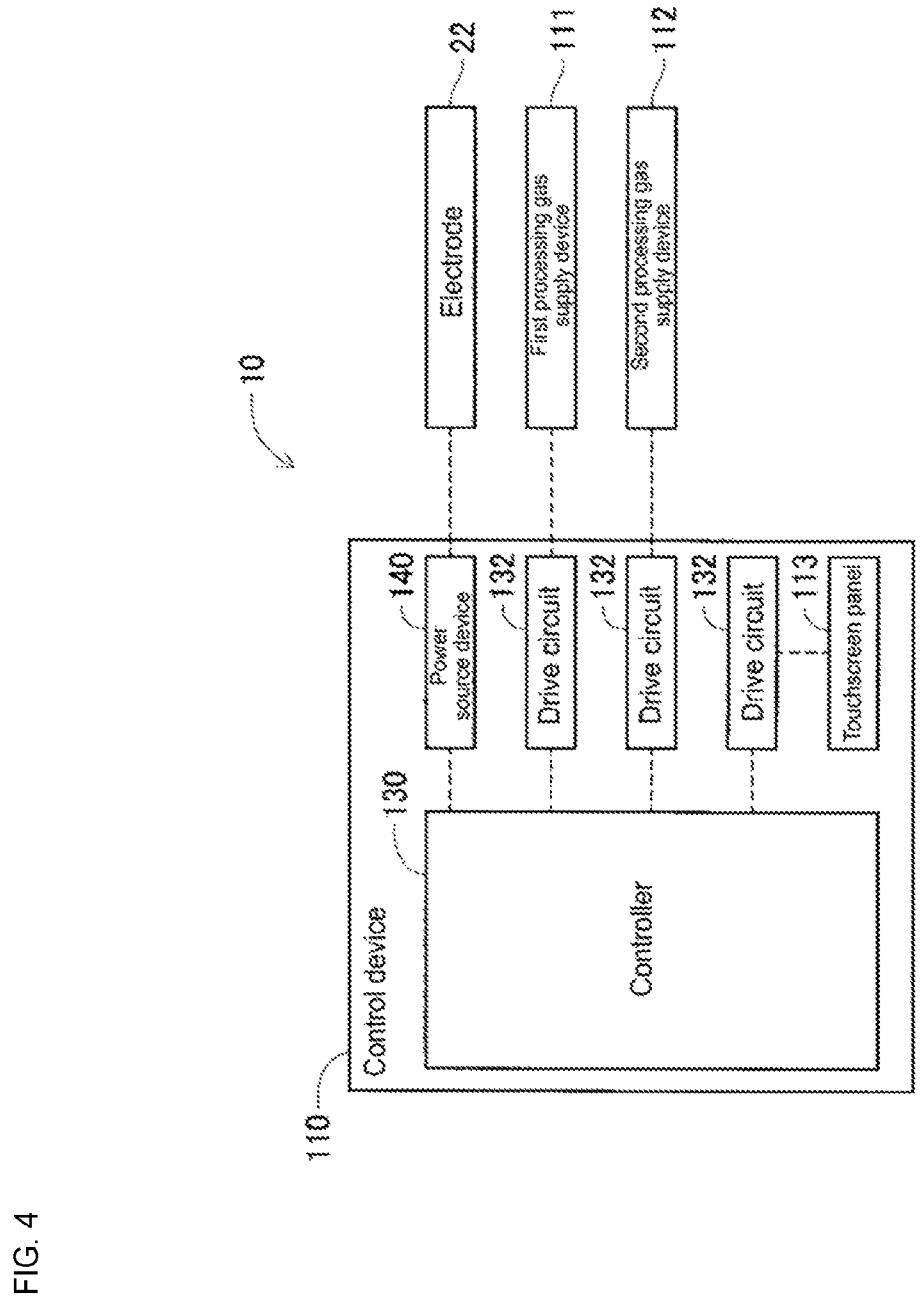
FIG. 4 is a block diagram showing a control system of the plasma-generating device.

Next, a control system of plasma-generating device 10 will be described with reference to FIG. 4. In addition to the above-described configuration, control device 110 includes controller 130, power source device 140, and multiple drive circuits 132. The multiple drive circuits 132 are connected to first processing gas supply device 111, second processing gas supply device 112, and touchscreen panel 113. Controller 130 includes a CPU, ROM, RAM, and the like, is configured mainly from a computer, and is connected to the multiple drive circuits 132 and power source device 140. Controller 130 controls power source device 140, first processing gas supply device 111, second processing gas supply device 112, touchscreen panel 113, and the like.

Electrical Leakage Detection by Detection Module

As shown in FIG. 1, power cable 40 that connects electrodes 22 of plasma head 11 and power source device 140 and supplies power to electrodes 22 is attached to robot arm 101 of industrial robot 100. Therefore, in accordance with the movement of robot arm 101, power cable 40 may be subjected to stress such as bending, resting, or pulling, and may be damaged. Thus, in plasma-generating device 10, detection module 120 detects an abnormal current caused by damage to power cable 40 or the like. Next, a detailed description will be given.

Figure 5:
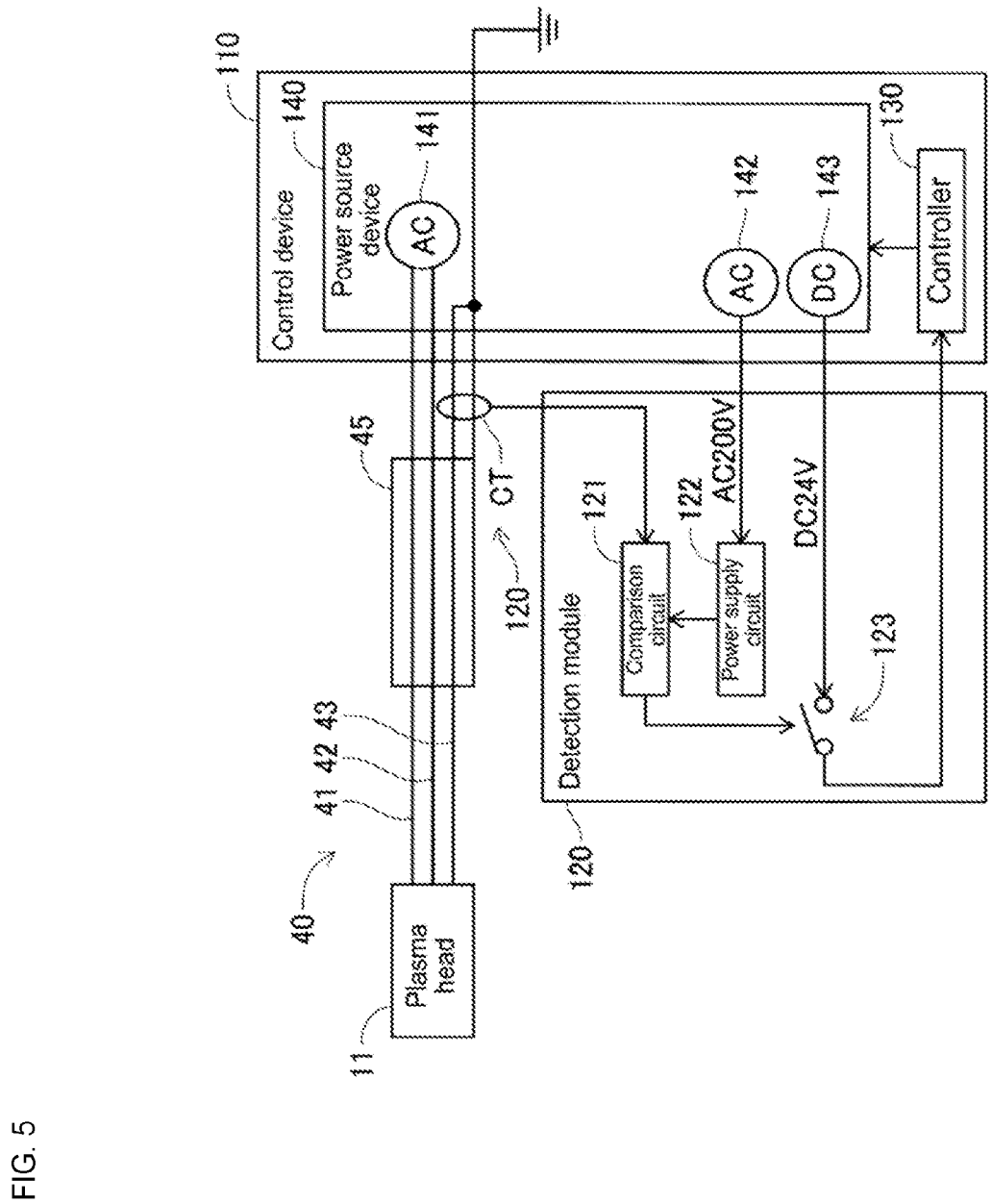
FIG. 5 is a block diagram showing the electrical configuration of a detection module.

As shown in FIG. 5, power source device 140 supplied from a commercial power supply (not shown) includes AC power supplies 141 and 142 and DC power supply 143. Detection module 120 includes current transformer CT, comparison circuit 121, power supply circuit 122, and switch 123. Power cable 40 includes first cable 41, second cable 42, and ground cable 43. Each of first cable 41, second cable 42, and ground cable 43 has an insulating body surrounding an electric wire. First cable 41, second cable 42, and ground cable 43 are shielded by a mesh-type conductive shield member 45. AC power supply 141 supplies AC power to plasma head 11 via first cable 41 and the second power supply cable. More specifically, each of first cable 41 and the second power supply cable supplies power to electrodes 22 and 22 of plasma head 11. Shield member 45 is grounded via ground cable 43.

Detection module 120 includes current transformer CT, comparison circuit 121, power supply circuit 122, and switch 123. Current transformer CT is attached to ground cable 43. Current transformer CT outputs a detection voltage corresponding to the value of the current flowing through ground cable 43 to comparison circuit 121. Power supply circuit 122 generates a driving voltage and a threshold voltage to be supplied to comparison circuit 121 from AC 200V supplied from AC power supply 142, and supplies the driving voltage and the threshold voltage to comparison circuit 121. Comparison circuit 121 outputs a voltage for turning on switch 123 when the detection voltage becomes equal to or higher than the threshold voltage. One end of switch 123 is connected to power supply circuit 122 that outputs DC 24V, and the other end is connected to controller 130. When a voltage for turning on the switch 123 is received from comparison circuit 121, switch 123 is turned on and outputs DC 24V to controller 130. On the other hand, when the voltage for turning on the switch 123 is not received from comparison circuit 121, switch 123 is turned off and DC 24V is not outputted to controller 130.

Here, when short-circuiting or discharging occurs between first cable 41 or second cable 42 and ground cable 43, a current flows from AC power supply 141 to the ground voltage, such that the detected voltage of current transformer CT becomes equal to or higher than the threshold voltage, and DC 24V is inputted to controller 130. Further, when short-circuiting or discharging occurs between first cable 41 and second cable 42, a current flows through shield member 45 by electromagnetic induction. As a result, a current flows through ground cable 43, the detected voltage of the current transformer CT becomes equal to or higher than the threshold voltage, and DC 24V is inputted to controller 130. In this manner, detection module 120 can detect a short circuit or a discharge between first cable 41 and second cable 42 as well as a ground fault of first cable 41 or second cable 42.

When the DC 24V is inputted by detection module 120, controller 130 instructs power source device 140 to stop the power supply of AC power supply 141 to plasma head 11. Further, each of the drive circuits 132 of first processing gas supply device 111 and second processing gas supply device 112 is instructed to stop supplying gas. As a result, supply of electric power to electrodes 22 and 22 of plasma head 11 is stopped, and supply of processing gas is stopped. In addition, an instruction to display a warning is issued to drive circuit 132 of touchscreen panel 113 such that, for example, the entire area is displayed in red, and a message indicating a leakage is also displayed.

Second Embodiment

Figure 6:
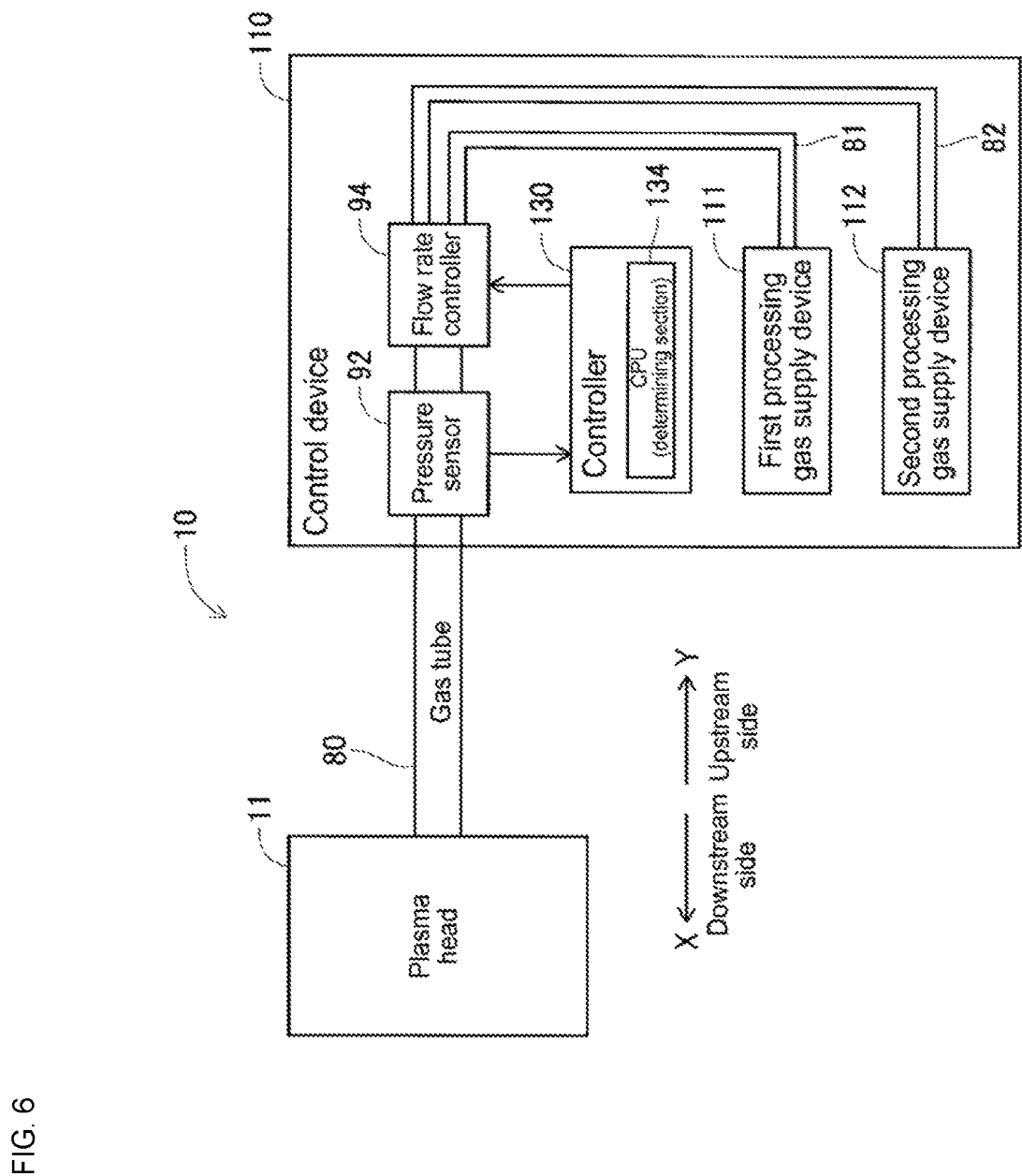
FIG. 6 is a schematic diagram showing a configuration related to the supply of processing gas in the plasma-generating device.

Next, a configuration related to the supply of processing gas in plasma-generating device 10 will be described. As shown in FIG. 6, plasma head 11 and control device 110 are connected by gas tube 80. Control device 110 includes pressure sensor 92, flow rate controller 94, controller 130, and the like, and pressure sensor 92 and flow rate controller 94 are controlled by controller 130. Controller 130 is connected to first processing gas supply device 111 and second processing gas supply device 112. Gas tube 80 has first gas tube 81 through which nitrogen gas supplied from first processing gas supply device 111 flows, and second gas tube 82 to which dry air supplied from second processing gas supply device 112 is supplied.

A program for performing determination processing is executed by CPU 134 (see FIG. 6) provided in controller 130. In this determination processing, the state of plasma-generating device 10 is determined based on whether the tube pressure between first gas tube 81 and second gas tube 82, which is defined for each flow rate of supplied processing gas, deviates from a standard value. When the pressures in first gas tube 81 and second gas tube 82 are equal to or higher than the standard value, it is determined that plasma is generated in plasma head 11 in a predetermined state. Here, the predetermined state means, for example, a state in which a specified amount of processing gas is supplied to plasma head 11 and plasma is stably generated. Further, when the pressure in first gas tube 81 and second gas tube 82 is equal to or lower than the standard value, the state of plasma-generating device 10 is determined to be abnormal. Here, abnormal means, for example, a case in which first gas tube 81 or second gas tube 82 is disconnected, a case in which processing gas is leaking to the outside due to breakage or breakage of a tube, a case in which the plasma is not being normally generated in plasma head 11, a case in which gas supply is defective, or the like. Further, the amount of leakage of the gas is determined according to the amount of the pressure decrease of the gas.

Also, touchscreen panel 113 displays various types of information necessary for operation of plasma-generating device 10.

Flow rate controller 94 controls the flow rate of gas supplied from first processing gas supply device 111 and second processing gas supply device 112 to first gas tube 81 and second gas tube 82. Flow rate controller 94 is arranged on the downstream side X of first processing gas supply device 111 and second processing gas supply device 112 and on upstream side Y of pressure sensor 92. As flow rate controller 94, for example, a known mass flow controller may be used.

With plasma-generating device 10, when the supply amount of processing gas is insufficient, it is difficult for plasma to be generated stably in plasma head 11. The supply amount of processing gas is controlled to a prescribed flow rate by flow rate controller 94. Flow rate controller 94 provides an appropriate gas supply amount for generating plasma.

Note that, specifically, the gas flow rate is adjusted by controlling the opening and closing of an automatic valve (not shown).

Pressure sensor 92 detects the pressure in first gas tube 81 and second gas tube 82. The pressure sensor 92 is arranged on the downstream side X of flow rate controller 94 and on the upstream side Y of plasma head 11. By detecting the pressure, it is possible to detect disconnection of gas tubes, leakage, and the like. In addition, it is possible to detect whether plasma is being generated properly.

Gas tube 80 including first gas tube 81 and second gas tube 82, along with first gas tube 81 and second gas tube 82, is composed of a flexible resin tube. For example, a tube made of Teflon (®) may be used.

Figure 7:
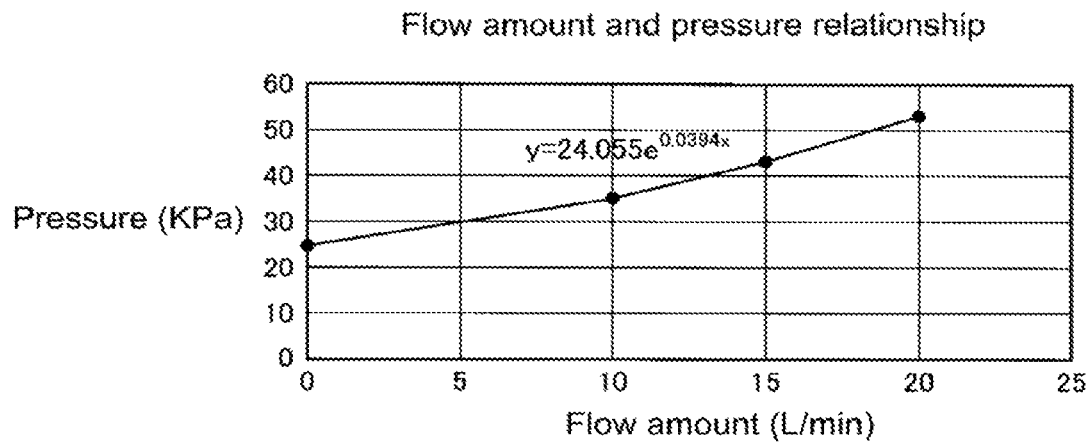
FIG. 7 is a graph showing the relationship between the gas flow rate and the pressure in the plasma-generating device.

FIG. 7 is a graph showing the relationship between the gas flow rate and the pressure in plasma-generating device 10. The horizontal axis represents the gas flow rate (L/min), and the vertical axis represents the pressure (kPa) in the gas tube. In a normal plasma-generating device 10 in which tubes or the like are not damaged or detached, the internal pressure with respect to the gas flow rate in a state in which plasma is not being generated is shown as a standard value. As the gas flow rate increases, the pressure inside first gas tube 81 and second gas tube 82 increases. Therefore, for each gas flow rate, the pressure corresponding to the gas flow rate is used as a standard value for detection of the internal pressure when determining the state of the device, and the state of the inside of the device is grasped by detecting a change in the pressure from the standard value.

Figure 8:
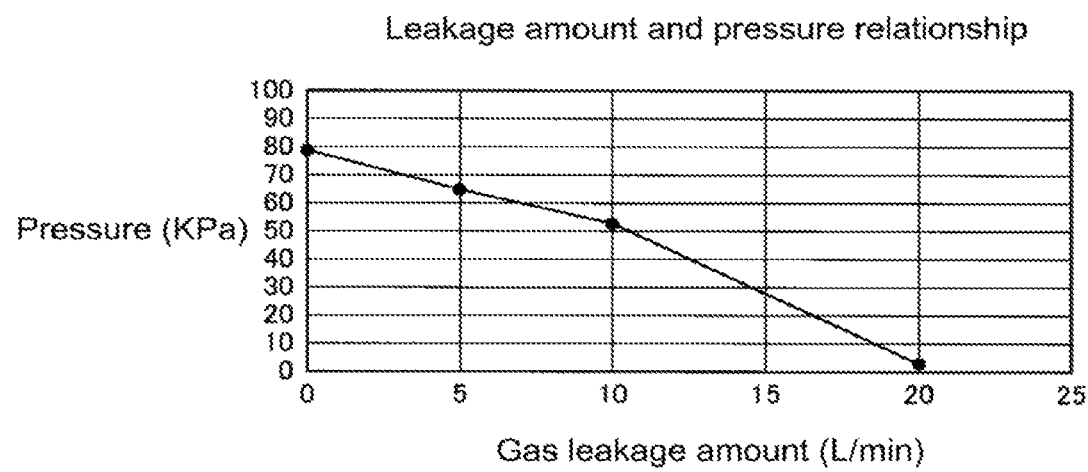
FIG. 8 is a graph showing the relationship between the gas leakage amount and the pressure in the plasma-generating device.

FIG. 8 is a graph showing the relationship between the gas leakage amount and the pressure in the plasma-generating device. The horizontal axis represents the gas leakage flow (L/min), and the vertical axis represents the pressure (kPa) in the gas tube. The graph shows how the pressure inside the tube changes when processing gas leaks from first gas tube 81 and second gas tube 82 in a case in which the pressure inside the tube is 80 kPa when there is no gas leakage. The pressure decreases from the standard value (in this case, 80 kPa) as the amount of gas leakage increases, and based on the pressure drop inside the tube detected by pressure sensor 92, it is determined as gas leakage by the determination processing. The predetermined pressure (standard value) in a state in which there is no gas leakage is obtained for each gas flow rate from the graph of FIG. 7. The extent of gas leakage can be determined by the degree of pressure drop with respect to the pressure (standard value) defined for each gas flow rate. In addition to gas leakage, the pressure drop may be due an abnormal discharge in plasma head 11, an abnormal state in which plasma is not generated, a state in which the supply of processing gas is insufficient, or the like. For these abnormal states too, the abnormal state can be determined by the pressure drop in the same manner as in the case of the gas leakage.

Figure 9:
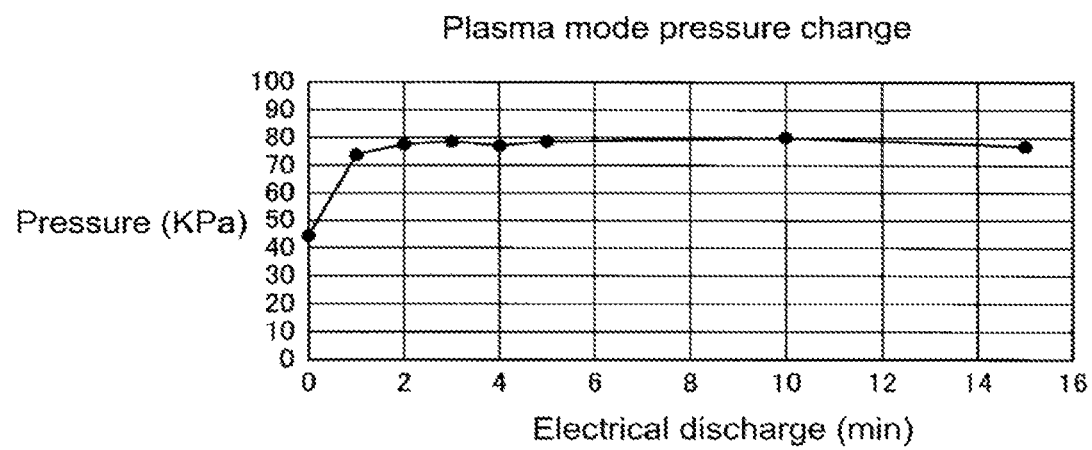
FIG. 9 is a graph showing the relationship between the time elapsed from the start of electrical discharge and the pressure (plasma mode pressure change) of the plasma-generating device.

FIG. 9 shows a change in internal pressure (plasma mode pressure change) over time from the start of discharge for generating plasma when plasma is generated in plasma head 11. The horizontal axis represents the elapsed time from the start of discharge (min), and the vertical axis represents the pressure in the gas tube (kPa). This graph shows a case when the pressure inside the tube is 45 kPa when there is no gas leakage. Generation of plasma is started by the start of discharge. The generation of plasma is promoted by a chemical reaction due to oxygen or the like existing in the dry air in the processing gas, and heat is generated along with the chemical reaction. The heat generated warms the processing gas, resulting in expansion of the processing gas. As the processing gas expands, gas stagnation occurs, and the pressure in plasma head 11 and the tubes rises. On the other hand, the generated plasma is ejected to the outside through connecting holes 36 together with the processing gas. After the plasma generation is stabilized, the pressure rise in plasma head 11 is balanced at a constant value. FIG. 9 shows that after plasma generation is stabilized, the internal pressure rises and balances at a pressure of approximately 80 kPa. Therefore, it can be determined that plasma is being generated normally when the pressure inside the tube rises to a predetermined pressure (in this case, approximately 80 kPa) from that before the start of discharge after a predetermined time has elapsed from the start of the discharge. If the pressure inside the tube does not rise to a predetermined value despite the discharge, it can be determined that the plasma is not being generated normally, or that the tube is detached, broken, or the like.

Next, a description will be given of an information browsing system via internet IN that allows the operating state of the present embodiment to be understood remotely. According to this information browsing system, information indicating the state and settings of each plasma-generating device 10 in production line 150 in which multiple plasma-generating devices 10 are installed in each factory, that is, various information such as abnormality information, alarm information, maintenance information, facility data, and the like can be uploaded to cloud server CS, and when necessary, the information can be downloaded to administrator terminal 160 and the support desk terminal 170 connected to internet IN such that the information can be browsed.

Figure 10:
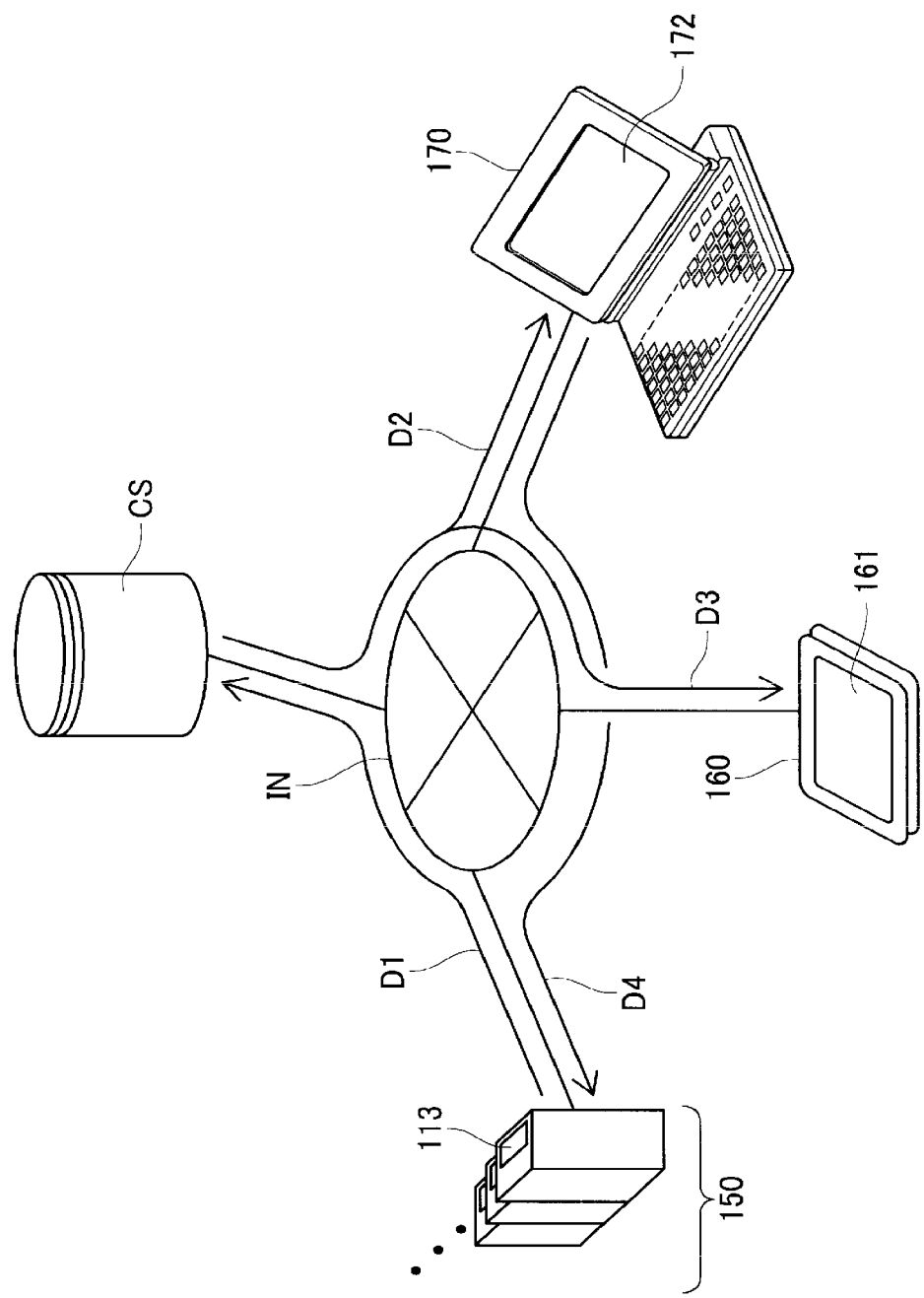
FIG. 10 is a configuration diagram of a network for browsing various information related to the plasma-generating device.

An information browsing system relating to plasma-generating device 10 will be described with reference to FIG. 10. First, various information such as settings and states of each plasma-generating device 10 installed in production line 10 is transmitted from control device 110 of each plasma-generating device 10 to cloud server CS via internet IN (D1). This transmission is performed periodically, and the information sent to cloud server CS is successively accumulated in cloud server CS. With an administrator who manages plasma-generating device 10 or production line 150 or at a support desk operated by a supplier of plasma-generating device 10, according to needs such as an inquiry from an operator, various kinds of required information for a required period of time can be downloaded from cloud server CS to a terminal of a user, that is, administrator terminal 160 or support desk terminal 170, and browsed (D2, D3). As a result, even when the administrator or the support desk is at a location away from plasma-generating device 10 or production line 150 and is unable to rush to the site in response to an inquiry from an operator, the administrator or the support desk can browse various required information for a required period of time, grasp the abnormal state, confirm the alarm information, refer to the maintenance information, the facility data, and the like, and instruct the operator to take an appropriate measure by telephone or the like.

Further, if support desk terminal 170 has a function of transmitting a message such as an email to plasma-generating device 10, support desk terminal 170 can transmit a message to the plasma-generating device 10 at the site where the operator is in charge (D4). A message may include, for example, "Check the gas tube", "Activate the breaker", or the like. The operator can perform measures in accordance with a message displayed on touchscreen panel 113.

Here, an example of various information displayed on display screen 161 of administrator terminal 160 or display screen 172 of support desk terminal 170 is shown.

When an item of the main menu displayed by the operation is selected, a main menu screen (not shown) is displayed on touchscreen panel 113 of plasma-generating device 10. On the main menu screen, selection buttons for selecting and displaying various types of information related to plasma-generating device 10 are arranged. The selection buttons include, for example, "Settings", "Operation", "Alarm", "Maintenance", "History", and the like, and when each selection button is selected, a screen corresponding to the selected button is displayed, and various types of information are displayed. The operator can browse various types of information on touchscreen panel 113 according to the selection, and confirm information such as the state and settings of plasma-generating device 10.

Figure 11:
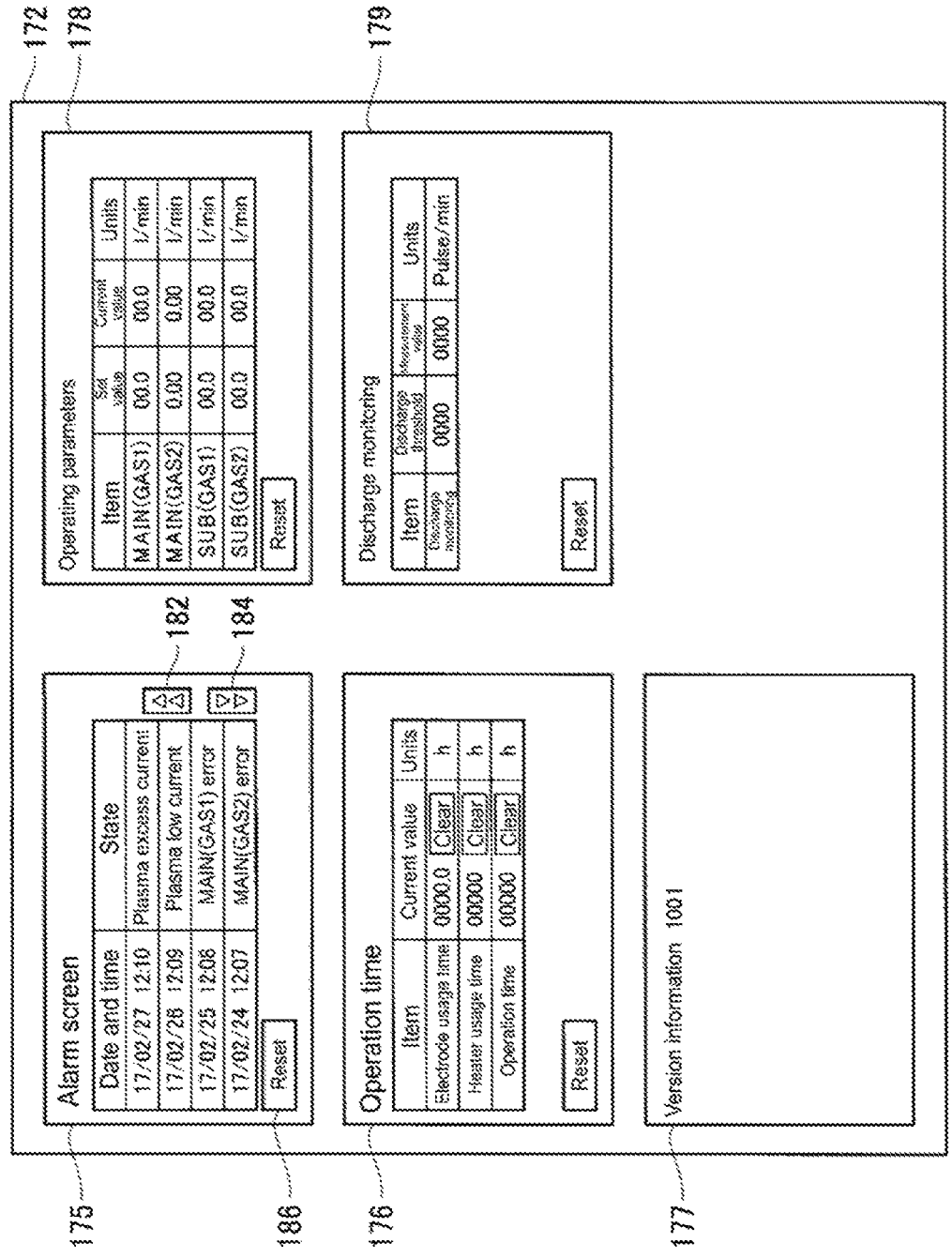
FIG. 11 is a diagram of the display screen of the support desk terminal.

On display screen 172 of support desk terminal 170, as shown in FIG. 11, it is possible to display a list of screens similar to the display screen of each piece of information browsed by the operator on touchscreen panel 113. This means various information can be grasped at one screen.

FIG. 11 shows a specific example of a case where display screen 172 of support desk terminal 170 is displayed. Display screen 172 of support desk terminal 170 displays a list of various information divided into five. 175 in the figure is an "Alarm screen". The contents of alarms generated in plasma generating device 10, such as abnormalities related to plasma generation and abnormalities related to gas, and the date and time of occurrence are displayed in chronological order. On the screen, the latest information is displayed at the top of the screen, and older information is displayed at the bottom of the screen. Scrolling can be performed by using up scroll button 182 and down scroll button 184. Note that, the display can be reset by reset button 186.

Number 176 in the figure represents "operation time". Items such as "electrode use time", "heater use time", "operation time", and the like are displayed, and the current values of these items are displayed. The display can be reset by touching the reset button.

177 in the figure is the "version information" screen. This displays the version information of the device. 178 in the figure is "operating parameters". This allows the gas flow amount to be checked. On this screen, the set value of flow rate controller 94, the current value of the gas flow rate, the units, and the like are displayed. Specifically, for example, it is possible to check the set values of the nitrogen of "MAIN(GAS1)", the dry air of "MAIN(GAS2)", the nitrogen of "SUB(GAS1)", and the dry air of "SUB(GAS2)" set by the flow rate controller 94, and the current flow rate of gases. The display can be reset by the reset button.

179 in the figure is "discharge monitoring". This is used to monitor the discharge required to generate the plasma. Specifically, the presence or absence of discharge is measured for each pulse of a predetermined cycle, and the number of pulses for which discharge has not occurred in a predetermined time period (in this case, 1 minute) is counted. That is, a threshold value of the number of discharge pulses required for generating plasma is set in advance as a discharge threshold value, and the number of discharge pulses is counted as a measurement value. If the number of discharge pulses does not reach the threshold value of the number of discharge pulses, measures such as an alarm are taken. Displayed on this screen are items such as the discharge pulse number threshold value in the discharge threshold value field, the discharge pulse number in the measurement value field, and the units. The display can be reset by the reset button.

Figure 12:
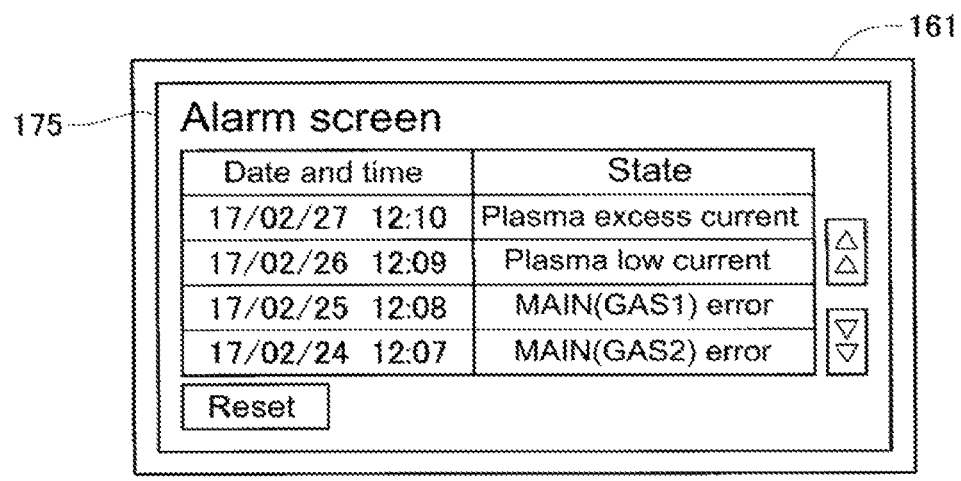
FIG. 12 is a diagram of the display screen of the administrator terminal.

FIG. 12 shows a specific example of a case of displaying on display screen 161 of administrator terminal 160. Due to constraints such as the size of display screen 161, one piece of information selected from the respective pieces of information is displayed. In FIG. 12 an example is shown in which alarm screen 175 is displayed, but items from FIG. 11 such as "operation time", "version information", "operating parameters", "discharge monitoring" can be selected and displayed.

Here, plasma-generating device 10 is an example of an atmospheric pressure plasma device. CPU 134 included in controller 130 is an example of a determining section. A determining processing program is executed by CPU 134. Specifically, gas leakage is determined in accordance with the decrease in pressure with respect to the gas leakage amount shown in FIG. 8, and it is determined that plasma is generated in accordance with the increase in pressure as time elapses from the start of electric discharge as shown in FIG. 9. Further, from the decrease in pressure, it is also determined that an abnormal discharge, an abnormal state in which plasma is not being generated, or a state in which the supply of the processing gas is insufficient, has occurred.

Note that, the present application is not limited to the above-mentioned embodiments, and various modifications and changes can be made within a range not departing from the spirit of the present application.

For example, the installation of pressure sensor 92 is not limited to the position of the present embodiment. Installation can be anywhere inside plasma head 11 so long as the position is such that the internal pressure can be measured.

Further, when the state of plasma-generating device 10 is confirmed on display screen 172 of support desk terminal 170, a message may be displayed on display screen 161 of administrator terminal 160 in addition to touchscreen panel 113 of plasma-generating device 10 or instead of touchscreen panel 113.

The graphs shown in FIGS. 7 to 9 and the contents of various information shown in FIGS. 11 and 12 are merely examples and the present disclosure is not limited to the figures shown therein. Further, the types of information are not limited to those shown in FIGS. 11 and 12.

REFERENCE SIGNS LIST

10: plasma-generating device;
11: plasma head;
80: gas tube;
81: first gas tube;
82: second gas tube;
92: pressure sensor;
94: flow controller;
110: control device;
111: first processing gas supply device;
112: second processing gas supply device;
113: touchscreen panel;
150: production line;
160: administrator terminal;
170: support desk terminal;
CS: cloud server;
IN: internet

The invention claimed is:

1. An atmospheric pressure plasma device comprising:
   a plasma head including a main body block;
   a reaction chamber, a first flow gas path, and a pair of second flow gas paths, each included in the main body block;
   a pair of electrodes respectively included in the second flow gas paths;
   a pair recesses included in the main body block, the pair of second flow gas paths respectively open into the pair of recesses, and the first flow gas path is formed between the pair of recesses;
   a gas tube configured to supply a gas to the plasma head, the gas tube including a first gas tube connected to the first flow gas path and a second gas tube connected to the pair of second flow gas paths;
   a flow rate controller configured to control a flow rate of the gas supplied to the gas tube;
   a pressure sensor arranged downstream of the flow rate controller and configured to detect a pressure in the gas tube; and
   a determining section configured to determine a state of the device based on how the pressure in the gas tube deviates from a standard value specified for each flow rate of the supplied gas.

2. The atmospheric pressure plasma device according to claim 1, wherein
   the determining section is configured to determine that plasma is being generated in the plasma head in a predetermined state when the pressure in the gas tube is equal to or higher than the standard value.

3. The atmospheric pressure plasma device according to claim 1, wherein
   the determining section is configured to determine the state of the device as abnormal when the pressure in the gas tube is equal to or lower than the standard value.

4. The atmospheric pressure plasma device according to claim 3, wherein
the determining section is configured to determine a leakage amount of the gas according to a decompression amount of the gas.

5. The atmospheric pressure plasma device according to claim 1, wherein
the flow rate controller is at a first end of the gas tube and the plasma head is at a second end of the gas tube.

\* \* \* \* \*